US006639227B1

(12) United States Patent
Glavish et al.

(10) Patent No.: US 6,639,227 B1
(45) Date of Patent: Oct. 28, 2003

(54) APPARATUS AND METHOD FOR CHARGED PARTICLE FILTERING AND ION IMPLANTATION

(75) Inventors: Hilton Glavish, Incline Village, NV (US); Causon Ko-Chuan Jen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 321 days.

(21) Appl. No.: 09/691,842

(22) Filed: Oct. 18, 2000

(51) Int. Cl.[7] ............................................. H01J 37/317
(52) U.S. Cl. ..................... 250/492.2; 250/296; 250/298
(58) Field of Search ........................... 250/492.21, 294, 250/295, 296, 298, 492.2

(56) References Cited

U.S. PATENT DOCUMENTS

| | | | |
|---|---|---|---|
| 3,984,682 A | | 10/1976 | Matsuda |
| 4,054,796 A | | 10/1977 | Naito |
| 4,645,928 A | | 2/1987 | Naito |
| 4,667,111 A | | 5/1987 | Glavish et al. |
| 4,697,086 A | | 9/1987 | Ishitani et al. |
| 4,839,523 A | * | 6/1989 | Taya et al. ............... 250/492.2 |
| 4,924,090 A | | 5/1990 | Wollnik et al. |
| 4,945,236 A | | 7/1990 | Mogami et al. |
| 5,132,544 A | * | 7/1992 | Glavish ................... 250/492.2 |
| 6,498,348 B2 | * | 12/2002 | Aitken ................. 250/396 ML |

FOREIGN PATENT DOCUMENTS

| | | |
|---|---|---|
| WO | WO 00/36630 A1 | 6/2000 |
| WO | WO 01/29876 A2 | 4/2001 |

OTHER PUBLICATIONS

"The Transport of Charged Particle Beams" A.P. Banford, E & F.N. Spon Limited, 1996 pp. 121–127.
"Production High Energy Ion Implanters Using Radio Frequency Acceleration", H.F. Glavish, et al., Nuclear Instruments and Methods in Physics Research B21 (1987) pp. 264–269.
"Electron and Ion Optics", Miklos Szilagyi, Plenum Press, 1988, pp. 45–47.
"Trochoidal Electron Monochromator", Stamatovic, et al, The Review of Scientific Instruments, vol. 39, No. 11, pp. 1752–1753 Nov. 1968.
"A New Mass Spectrometer With Improved Focusing Properties" Walker Bleakney, et al., Physical Review, vol. 53, pp. 521–529 Apr. 1938.
"Antiproton—Proton Cross Sections at 133, 197, 265, and 333 Mev", Charles Coombes, et al. Physical Review, vol. 112, No. 4, pp. 1303–1310, Nov. 1958.
"Purity of High Energy Beams in R.F. Linear Accelerator Based Implanters", E. K. McIntyre, et al., Ion Implantation Technology, 96, pp. 367–370.
"Ion Beams With Applications to Ion Implantation" Roger G. Wilson, et al., 1973.

* cited by examiner

Primary Examiner—John R. Lee
Assistant Examiner—Paul M. Gurzo
(74) Attorney, Agent, or Firm—Boult Wade Tennant; Joseph Bach

(57) ABSTRACT

A charged particle filter provides a curved through path and has both magnetic poles for applying a magnetic field normal to the plane of curvature of the path and electrodes for applying a radial electric field. The filter is used as an energy filter downstream of an accelerator in an ion implanter. The filter can be set to provide a range of energy dispersions, to operate as an achromatic bend, or to reject lower charge state ions.

17 Claims, 13 Drawing Sheets

APPARATUS AND METHOD FOR CHARGED PARTICLE FILTERING AND ION IMPLANTATION

FIELD OF THE INVENTION

The invention is concerned with charged particle filters and filtering and more particularly with ion implanters which may incorporate such filters and methods of ion implantation.

BACKGROUND OF THE INVENTION

Charged particle filters, sometimes referred to as particle separators, are known in the art for the purpose of separating out unwanted particles from wanted particles in a particle beam. A summary of known such filters or separators is given in Chapter 7, from page 121 of the text book, The Transport of Charged Particle Beams, by A. P. Banford, published by E & F N Spon Limited, London, 1966.

A sector magnetic field can be used to provide separation of charged particles by their momentum to charge ratio. Such devices are commonly used as mass analysers and in mass spectrometry, to separate particles by mass when the energy and charge of the particles is assumed to be the same.

An electric field on its own may also be used for particle separation, in which case the filter acts as an energy filter for particles of the same charge state. An example of a pure electrostatic filter, called an inflector, used in a high energy ion implanter, is disclosed in Production High Energy Ion Implanters Using Radio Frequency Acceleration by Glavish et al, Nuclear Instruments and Methods in Physics Research B21 (1987) 264–269.

Cross field devices are also known in which orthogonal electric and magnetic fields are provided simultaneously for the deflection of charged particles. See for example the above mentioned chapter in the book by A. P. Banford, and also pages 45 to 47 of Electron and Ion Optics by Miklos Szilagye published 1988 by Plenum Press. In particular, there is the well known Wien filter which is a straight path cross field filter, in which orthogonal electric and magnetic fields are directed perpendicular to a straight path through the filter. A Wien filter operates effectively as a pure velocity filter which is independent of the mass or charge of the particles in the beam.

Other cross field devices are described in
 i) Trochoidal Electron Monochromator, by Stamatovlc et al, The Review of Scientif Instruments, Vol. 39, No. 11, pages 1752–1753, November 1968;
 ii) A New Mass Spectrometer with Improved Focusing Properties, by Bleakney et al, Physical Review, Vol. 53, pages 521 to 529, April 1938;
 iii) Antiproton—Proton Cross Sections at 133, 197, 265 and 333 MeV, by Coombes et al, Physical Review, Vol. 112, No. 4, pages 1303–1310, November 1958.

References i) and ii) contemplate providing trochoidal paths for charged particles passing through the devices so that the particle motion through the device can be in the electric field direction. Reference iii) appears to contemplate a velocity filter providing no deflection to required antiprotons.

Considering in particular the application of charged particle filters to ion implanters, ion implanters using radio frequency acceleration are known in, for example, U.S. Pat. No. 4,667,111, assigned to the Eaton Corporation, and also U.S. Pat. No. 6,423,976, assigned to Applied Materials, Inc. RF acceleration tends to produce a beam of ions having a band of energies, so that an energy filter is required if the beam to be implanted is to have high energy purity.

The use of a pure electrostatic energy filter or "inflector", which bends the accelerated beam through a predetermined angle in order to provide the required energy dispersion at an exit aperture of the filter, can work satisfactorily at high energies but still has the following problems (see the Glavish et al reference above). It is impracticable to use such a filter when operating the ion implanter at high beam current and relatively lower implant energies. For example, if the ion implanter is operated in "drift mode" with the rf accelerator effectively turned off, an electric field is still required to bend the beam through the curved path of the energy filter. The presence of an electric field removes highly mobile electrons from the beam envelope so that the lower energy beam tends to blow up through space charge effects. Also, even at high energies using rf acceleration, the electrostatic inflector type energy filter cannot distinguish between particles of the same mass at different charge states and corresponding different energies. For example, the electrostatic inflector cannot distinguish between doubly charged phosphorus ions and singly charge phosphorus ions at half the energy of the doubly charged phosphorus ions. This can be important especially when multiply charged ions are used for higher energy applications.

The use of a pure magnetic sector filter as an energy filter for particles of the same charge to mass ratio is described in Purity of High Energy Beams in R. F. Linear Accelerator Based Implanters, by McIntyre et al, Ion Implantation Technology –96, pages 367–370. Such a magnetic sector filter can overcome the problems of transporting a low energy beam successfully through the filter. However, a magnetic sector filter has only approximately half the energy resolving power of an electrostatic inflector of the same path length. Furthermore, a magnetic field filter like an electric field filter will still pass particles of the same mass and different charge states at appropriate different energies. For example, a magnetic filter could not distinguish between doubly charged phosphorus and singly charged phosphorus at a quarter of the energy of the doubly charged phosphorus.

The use of straight path cross field filters (Wien filters) as velocity analysers in ion implanters has been proposed; see for example the book Ion Beams with Applications to Ion Implantation, by Wilson and Brewer, published 1973 by Robert E. Krieger Publishing Company, Inc., particularly pages 213–214, 431–435, 439–443 and 458–459. Wien filters have also been used as velocity filters in ion implanters sold prior to 1970 by Accelerations, Inc. and by High Voltage Engineering Corporation. However, a Wien filter is a pure velocity filter which is not sensitive to the charge state of the particles and so cannot distinguish between particles at different charge states and the same velocity. This is important in the case of scanning beam type implanters when the filtered beam is subsequently scanned either magnetically or electrostatically, since the ions at different charge states will be effected differently by the scanning field which can give rise to dose non-uniformities over the implanted wafers, and unwanted deviations in the implant angle into the wafer.

It is an object of embodiments of the present invention to provide a charged particle filter which can obviate some or all of the above problems with prior art filters.

More generally it is an object of the invention to provide a novel form of charged particle filter which may have applications not available from the prior art filters.

SUMMARY OF THE INVENTION

This invention provides a charged particle filter comprising a beam channel having a beam entrance and a beam exit, said beam channel defining, between said entrance and said exit, a predetermined curved path, in a plane of curvature, for a beam of charged particles transported through the filter, electrodes arranged for producing over said curved path an electric field in said plane substantially perpendicular to said path, and magnetic poles arranged for producing over said path magnetic field substantially normal to said plane.

The predetermined curved path normally has a constant radius of curvature and said electrodes are arranged to produce a radial electric field.

Such a curved path cross field filter has special attributes and advantages which will become apparent in the further discussion that follows and which are especially, though not exclusively, useful when the filter is used as an energy filter for an ion implanter, in particular following an rf accelerator. In particular, a curved path filter is sensitive to the charge state of beam particles of the same mass, so that particles of unwanted charge state can be filtered out.

The curved path filter described above can be used in four different modes.

a) Magnetic field only:

This mode can be used to transport low energy relatively high current beams around the filter curvature with minimal space charge blow up of the beam. This is especially useful when a high energy implanter with the capability of radio frequency acceleration, is to be operated at relatively low energy, e.g. with the rf accelerator turned off (in "drift mode").

b) Electrostatic field only:

This mode is useful to provide relatively high energy dispersion as the beam is transported around the curvature of the filter, in order to provide good energy resolution of the beam delivered for implantation. An electrostatic field on its own provides approximately twice the energy resolving power of a magnetic field for the same path curvature through a filter. This is useful for energy filtering beams after rf acceleration. However, an electrostatic field may also be useful for removing from the beam ions having half the required charge state and a quarter of the required energy. When operating a beam of doubly charged ions, say doubly charged phosphorus ($P^{2+}$), the ion source will normally also produce singly charged $P_2$ ions. Such $P_2^+$ ions will decompose to $P^+$ and P, each taking half the energy of the original $P_2^+$. Assuming the ions from the ion source are accelerated through a dc field V, the $P^{2+}$ ions will be accelerated to an energy of 2V electron volts and the $P_2^+$ ions will be accelerated to an energy of V electron volts. After decomposition, the $P^{30}$ ions thus have an energy of V/2 electron volts, one quarter of the energy of the desired $P^{2+}$ ions. Ions with half the charge and a quarter of the energy cannot be separated from desired ions in a magnetic field alone, resulting in quarter energy pollution of the ion beam. In the field of mass spectrometry a corresponding effect produces so called "Aston" bands. An electric field sector filter can remove these Aston bands.

c) Electric field mode, with additional magnetic field having a selected polarity requiring either an increased or a decreased electric field to transport the beam around the curvature of the filter:

In this mode, the energy dispersion of the filter can be increased or decreased relative to that of the mode with electric field alone. This can be useful in producing beams for implantation having very high energy resolution, and can also be used to provide a predetermined energy dispersion in the beam travelling on from the filter, e.g. for counteracting energy dispersion in subsequent beam scanning arrangements. When the polarity of the magnetic field requires increased electric field in this mode, the magnetic field can be regarded as a bucking field. This will be referred to herein as magnetic bucking mode.

d) Adding electric field to the magnetic field mode in such a polarity as to oppose and increase the required magnetic field to transport the beam around the curvature of the filter:

In this mode, which will be referred to as electric bucking mode, the energy dispersion of the filter can be reduced below that of electric field alone mode. In fact, a combination of electric field and magnetic field can be set which can provide achromatic beam transport. This can be particularly useful in beam transport applications where it is required to eliminate beam spot broadening arising from energy spread in the beam. Also in this mode, the electric and magnetic fields can be adjusted to pass a multiply charged beam ion and reject all lower charge state ions of the same mass irrespective of the energy of the lower charge state ions.

The present invention is also concerned with a problem which can arise generally with scanned beam type ion implanters. These typically employ electrostatic or electromagnetic scanning fields which produce a degree of energy dispersion. The energy dispersion of the scanning arrangement can broaden the beam reaching the substrate for implantation.

The present invention also contemplates an ion implanter comprising an ion beam generator providing a beam of ions to be implanted in a substrate, a beam scanner to scan said beam at least in a scan plane to provide a scanned beam at said substrate, said scanner producing in said scanned beam a first amount of energy dispersion in a first sense in said plane, and a dispersion controller to produce in the beam before the beam is scanned by said scanner, a second amount of energy dispersion in a second sense in said plane opposite to said first sense. In this way, any energy dispersion introduced into the beam by the scanning arrangement can be counteracted and reduced by the dispersion controller.

In a practical arrangement, the dispersion controller may take the form of a cross field curved path charged particle filter of the kind disclosed generally above. As has been explained, the amount of dispersion applied by such a curved path cross field filter can be adjusted when operating the filter in the combined field mode. However, other forms of dispersion controller may also be contemplated, including the straight line Wien type filter. To provide controllable energy dispersion of an ion beam, without varying the beam direction leaving the dispersion controller, both magnetic and electric fields are required. In the above described curved cross field filter and also in the known Wien filter, the magnetic and electric fields are applied to the charged particle beam over the same region of the beam, so that the particles of the beam experience both fields simultaneously. However, a dispersion controller could apply the magnetic and electric fields to different spatial regions of the beam, so that beam particles experience the two fields in succession. This arrangement would have the disadvantage of increasing the beam path through the dispersion controller and in the case of an ion implanter, would tend to increase the overall size or "footprint" of the ion implantation tool.

In an ion implanter, a typical beam scanner comprises a beam direction scanner to scan the direction of said beam at least in said scan plane, and a beam collimator to collimate the scanned beam direction in said plane to provide a collimated scanned beam at the substrate. Then, in a preferred embodiment of the present invention, each of said direction scanner and said collimator are arranged to produce a respective charge state and energy dependent dispersion in said first sense in said plane, to contribute to said first amount of energy dispersion. This is contrary to the normal arrangement of beam direction scanners and beam collimators in ion implanters with rf acceleration, which are usually arranged to provide energy dispersion in opposite directions to minimise the overall energy dispersion at the substrate. However, with the dispersion controller providing a cancelling dispersion of the beam before the beam direction scanner, the overall dispersion at the substrate can be reduced even when both the direction scanner and the collimator tend to produce energy dispersion in the same sense.

Arranging for both the beam direction scanner and the collimator to provide energy dispersion in the same sense can also have in itself advantages as will be explained later herein.

The invention also provides a method of filtering charged particles comprising using a combination of both electric and magnetic fields to bend a beam of charged particles so that desired particles follow a predetermined curved path. In another aspect, the invention provides a method of ion implantation comprising the steps of generating a beam of ions to be implanted in a substrate, scanning said beam at least in a scan plane to provide a scanned beam at said substrate, whereby said scanning produces in said scanned beam a first amount of energy dispersion in a first sense in said plane, and producing in the beam, before the beam is scanned, a second amount of energy dispersion in a second sense in said plane opposite to said first sense.

Examples of the invention will now be described in more detail with reference to the accompanying drawings.

DETAILED DESCRIPTION OF THE PREFERRED EMBODIMENTS

Figure 1:
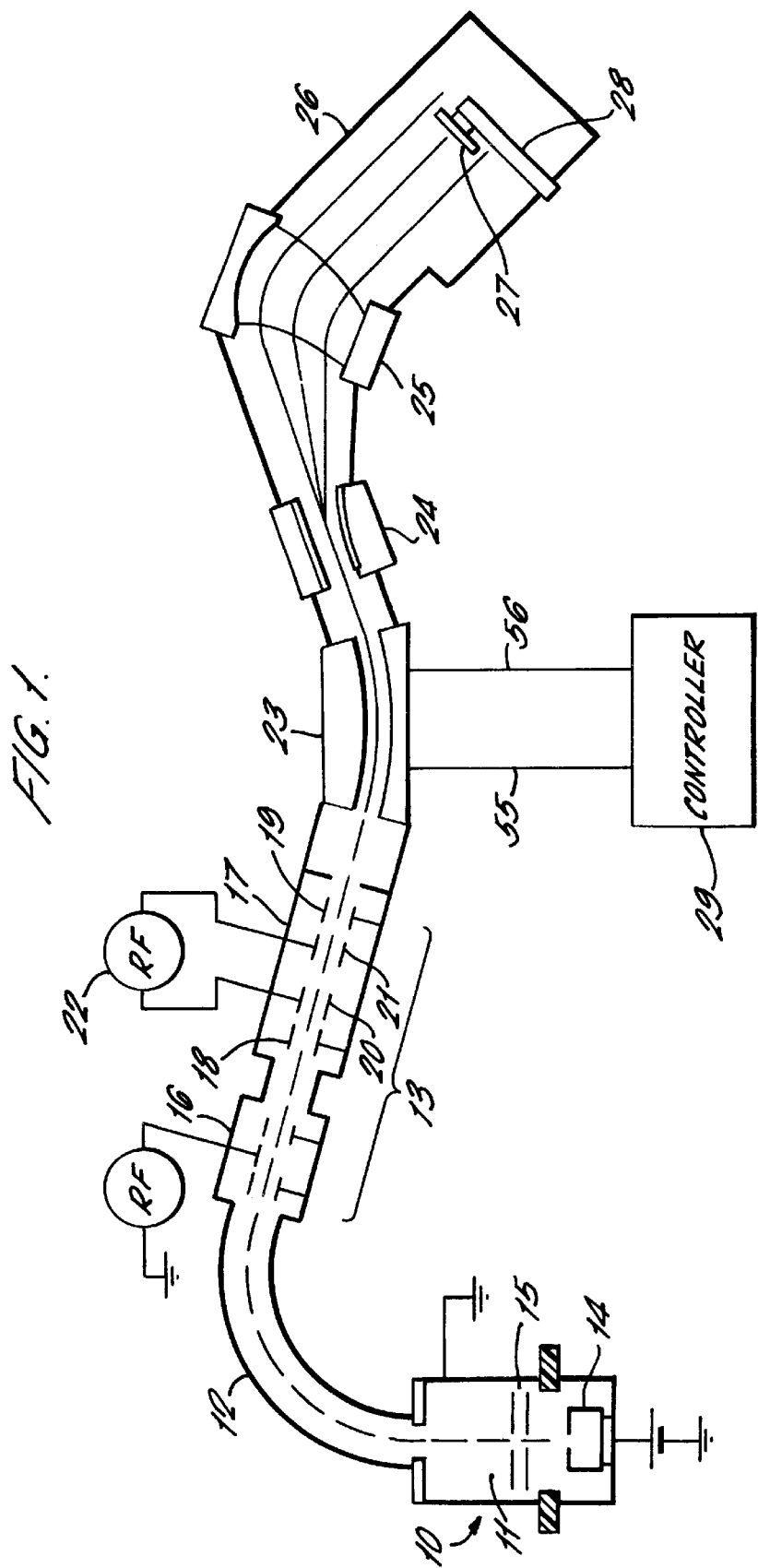
FIG. 1 is a schematic view of an ion implanter incorporating a curved path cross field filter and embodying aspects of the present invention.

In FIG. 1, an ion source 10 produces a beam 11 of ions which then enters a magnetic sector type analyser 12. In the analyser 12, ions entering the analyser with the same energy and charge state are separated effectively by mass so that only ions of a desired mass enter the aperture of an RF accelerator assembly 13.

The ion source 10 comprises an arc chamber 14 in which ions of a desired species are formed. These ions are drawn from an aperture in a front face of the arc chamber 14 by an electric field generated between the arc chamber 14 and an extraction electrode assembly 15. Typically, the final electrode of the extraction electrode assembly 15, together with the body of the magnetic sector analyser 12, are held at ground potential, while the arc chamber 14 is held at a predetermined positive potential, so that most ions entering the analyser 12 have a corresponding predetermined energy.

In the magnetic analyser 12, a magnetic field directed transverse to the direction of the ion beam causes ions of different momentum to charge ratio to adopt paths with different curvature. The strength of the magnetic field in the analyser 12 is selected, in relation to the predetermined energy of the ions of the beam, so that ions of the required species for implantation are presented at the entrance aperture of the RF accelerator 13.

The operation of the ion source 10 in combination with the magnetic sector analyser 12 will be well known to those skilled in the art of ion implanters.

RF accelerator 13 includes a buncher 16, followed by at least a single radio frequency booster stage 17. The radio frequency booster stage 17 illustrated in this figure is a three gap booster stage (or cell) comprising entrance and exit electrodes 18 and 19, held at ground potential, and a pair of intermediate electrodes 20 and 21 which are electrically excited with a 180° mutual phase difference from an RF source 22. The operation of a three gap booster as illustrated in FIG. 1 for accelerating a charged particle beam, is well understood to those skilled in the art of particle accelerators and is also described in U.S. application Ser. No. 09/321, 731, assigned to Applied Materials, Inc., the disclosure of this application being incorporated herein in its entirety by reference.

The buncher 16 is arranged to modulate the energy of ions of required mass from the analyser 12 so that a higher proportion of these ions arrive at the first gap between electrodes 18 and 20 of the booster stage 17 during the part of the period of the RF signal from RF drive 22 during which the bunch of ions will be accelerated across the first gap. Thus, the buncher 16 can increase the proportion of ions from the analyser 12 which will be accelerated by the booster 17 to the target acceleration energy as they leave the booster through the final exit electrode 19. The use of bunchers to increase the current of charge particles accelerated by an RF accelerator is well known and discussed in the literature relating to particle accelerators and is also referred to in the aforementioned pending U.S. patent application.

It should be understood that the ion implanter illustrated in FIG. 1 may be operated with the RE accelerator 13 providing an energy boost to ions from the analyser 12, or may alternatively be operated with the RF accelerator quiescent (with electrodes 20 and 21 fixed at ground potential), providing no energy boost, so that ions leave the accelerator 13 at the same energy with which the ions travelled through the analyser 12. This latter mode is sometimes referred to as "drift mode". In some embodiments, the RF accelerator may be replaced by a DC accelerator of known design.

In either case, ions leaving the accelerator 13 then pass through filter 23, followed by a beam scanner 24 and a scanned beam collimator 25. The filter 23 may be operated to limit the energy spread of ions in the ion beam passing through the filter on to the scanner 24. The beam scanner 24 may be electrostatic, but is preferably electromagnetic (e.g. to avoid beam blow up from space charge forces), and is effective to scan the beam, in the plane of the paper in FIG. 1, at a relatively high scanning rate, typically 100 Hz or more. The scanner 24 is effective to scan the angle through which the beam is bent as it passes through the scanner 24. The scanned beam collimator 25, may also be electrostatic but is preferably electromagnetic in operation. The magnetic field of the collimator 25 is tailored so that the scanned beam is bent as it passes through the collimator 25 by differing amounts according to the angle of deflection from the scanner 24. The overall result is that the scanned beam emerging from the collimator 25 is essentially parallel as illustrated.

The parallel scanned beam enters a process chamber 26 in which a semiconductor wafer for implantation may be mounted on a carrier or chuck 27. The chuck 27 is in turn mounted on a scanning arm 28 which is mounted to enable the wafer on the carrier 27 to be scanned mechanically in a direction generally perpendicular to a line lying in the plane of the scanned ion beam and perpendicular to the ion paths of the scanned ion beam. The wafer may be scanned at various angles to the plane of the scanned ion beam, i.e. the mechanical scanning is not restricted to being normal, or nearly normal, to the plane of the scanned ion beam. The combination of fast scanning of the ion beam in the plane of the paper, and a relatively slower mechanical scan of the wafer on carrier 27 through the scanned beam, can ensure that ions from the ion beam are implanted evenly over the entire surface of a semiconductor wafer mounted on the carrier 27. Processed wafers can be removed from the carrier 27 and passed out of the process chamber 26, and fresh wafers for processing brought into the chamber, via a loadlock system which is not shown in FIG. 1. A preferred form of process chamber which may be used for chamber 26 is illustrated in International Patent Application WO 99/13488.

Figure 2:
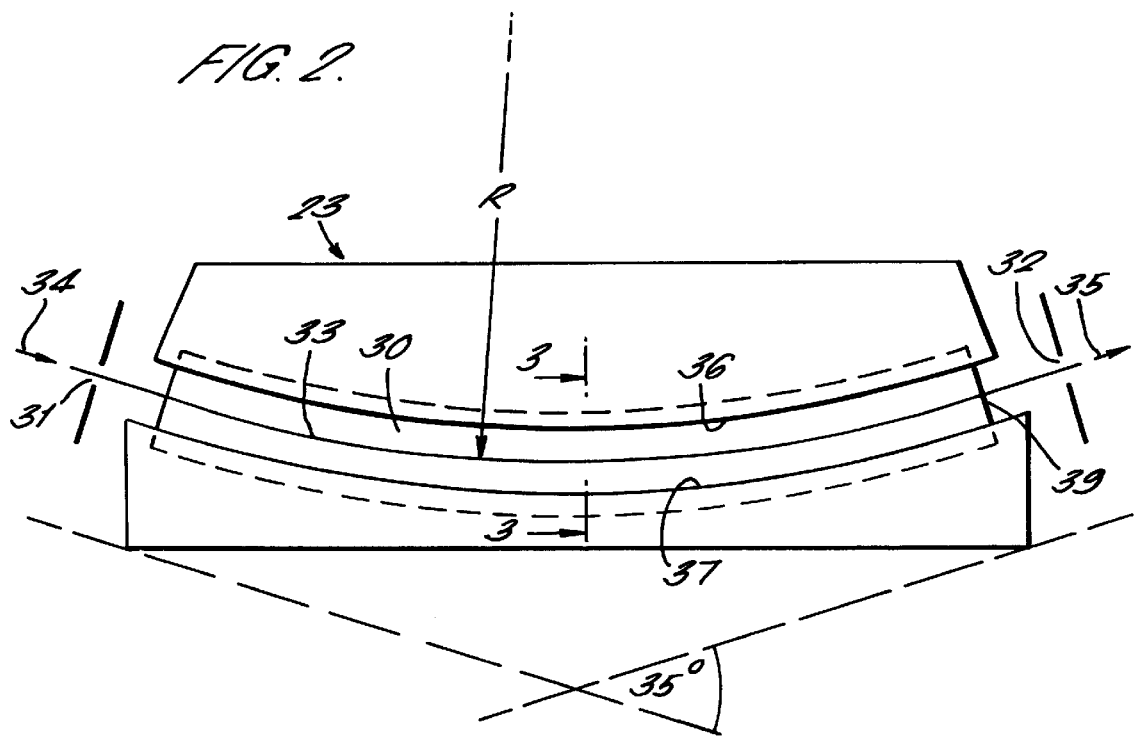
FIG. 2 is a schematic illustration in plan view of a curved path cross field filter embodying the present invention.
Figure 3:
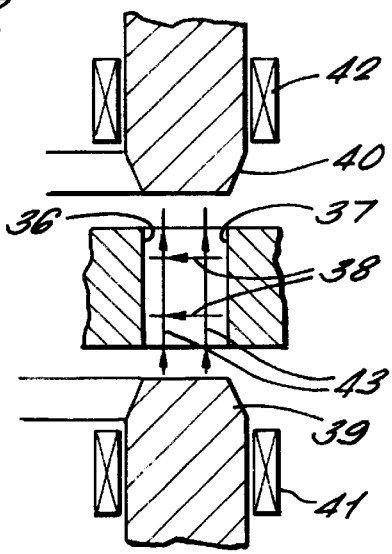
FIG. 3 is a cross-sectional view taken along line 3—3 in FIG. 2 across the beam path through the filter.

The filter 23 is illustrated in more detail, but still schematically, in FIGS. 2 and 3. In FIG. 2, the filter 23 is formed with an arcuate beam passage 30, extending between an inlet aperture 31 and an outlet aperture 32. The passage 30 in combination with the inlet and output apertures 31 and 32 define a curved beam path 33 through the filter having a predetermined radius of curvature R. The path 33 through the filter 23 bends through a total angle, between the input beam axis 34 and the output beam axis 35, of about 35° in the illustrated embodiment. A greater angular sector could be used if greater filtering resolution is required, for example in magnetic field only operation. However, a sector of only 35° has been found sufficient, particularly in the ion implanter application described. Indeed, a smaller angular sector could also be used, so long as it is still sufficient to remove ions of unwanted charge state, and also to provide adequate energy resolution. However, as has been explained above, energy resolution can be enhanced using both an electric field in combination with a magnetic field in magnetic bucking mode.

In the particular application of an ion implanter as described herein by way of example, a relatively low sector angle for the filter can be advantageous in terms of overall beam line geometry, and the resulting footprint of the ion implanter tool.

Referring again to FIGS. 2 and 3, the passage through the filter is bounded on the inside and outside of the curved path respectively by an inner electrode 36 and an outer electrode 37. In operation, an electric potential can be applied between the inner and outer electrodes 36 and 37 to create a desired electric field 38 extending transversely of the curved path 33, substantially parallel to the plane of the paper in FIG. 2, and radially relative to the centre of curvature of the path. In electric field only mode, the potential applied between the electrodes 36 and 37 has the polarity required to bend the ions along the curved path 33 through the filter.

The channel 30 is bounded above and below the electrodes 36 and 37 by magnetic poles 39 and 40 of an electromagnet (best seen in FIG. 3). In FIG. 2, the uppermost pole is removed for clarity so that only the pole 39 beneath the electrodes 36 and 37 is illustrated. Coil windings 41 and 42 are provided to create a magnetic field 43 extending between the poles 39 and 40, so as to be orthogonal both to the curved path 33 and to the electric field 38. In magnetic field only mode, the polarity of the magnetic field 43 is again such as to cause the beam ions to be deflected along the curved path 33 through the filter.

As mentioned previously, the filter illustrated in FIGS. 2 and 3 can be used also with both magnetic and electric fields simultaneously. Referring to FIG. 1, a controller 29 can be set to control the magnitude and polarity of electric potentials supplied to the electrodes 36 and 37, and to control the magnitude and direction of energising current supplied to coil windings 41 and 42. This control is illustrated schematically in FIG. 1 by the lines 55 and 56 connecting the controller 29 to the filter 23.

The principles of operation of the filter 23 will now be explained.

If the sign convention is adopted wherein positive magnetic B and electric field E polarities cause each of the fields to contribute positively to bending the beam through the filter along the required curved path 33, then balancing the centrifugal force with the electromagnetic Lorentz force leads to the equation $$qE + qBv = \frac{mv^2}{R} \quad (1)$$

where v is the particle velocity
R is the filter radius
m is the particle mass, and
q is the particle charge.

Figure 4:
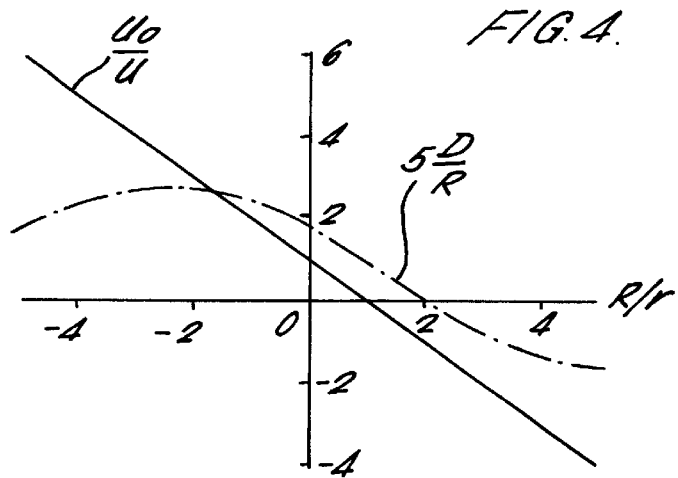
FIG. 4 is a graphical representation of mathematical equations defining functional parameters of the filter.

It is convenient to write eq. (1) in the simplified, dimensionless, parametric form $$\frac{U_0}{U} = 1 - \frac{R}{r} \quad (2)$$

where $$U = \frac{1}{2}mv^2 \quad (3)$$

is the particle energy, $$U_0 = \frac{1}{2}qRE \quad (4)$$

is the electric field filter energy, and $$r = \frac{mv}{qB} \quad (5)$$

is the magnetic field bend radius. The quantities $U_0$ and $r$ have a very simple physical interpretation. In a pure magnetic field B a beam particle of energy U would describe a circular trajectory of radius r. In a pure electric field E a beam particle of energy $U_0$ would describe a circular trajectory of radius R equal to the geometrical radius of the filter. A graph of $$\frac{U_0}{U}$$

versus $$\frac{R}{r}$$

is shown in FIG. 4, from which can be seen:

1. The two right quadrants correspond to a positive magnetic field B>0, while the upper left quadrant corresponds to a negative or bucking magnetic field B<0.
2. If $U_0$=0 then E=0 and the filter becomes a pure magnetic field filter with r=R.
3. If U=$U_0$ then r=∞ and the filter becomes a pure electric field filter.
4. Since the beam particle energy must always be positive (i.e. U≧0) the upper two quadrants necessarily correspond to a positive electric field E≧0, and the lower right quadrant to a negative or bucking electric field E<0, (i.e. $U_0$<0)

It can also be shown that if an ion now enters the filter with a velocity v+δv rather than v and bends through an angle φ then to first order in $$\frac{\delta v}{v},$$

as a result of the shift δv in velocity, the ion position becomes transversely displaced by an amount $$D\frac{\delta v}{v},$$

where $$\frac{D}{R} = \frac{\left(\frac{R}{r} - 2\right)}{1 + \left(\frac{R}{r} - 1\right)^2} \left\{ \left( \cos\phi \sqrt{1 + \left(\frac{R}{r} - 1\right)^2} \right) - 1 \right\} \quad (6)$$

Figure 5:
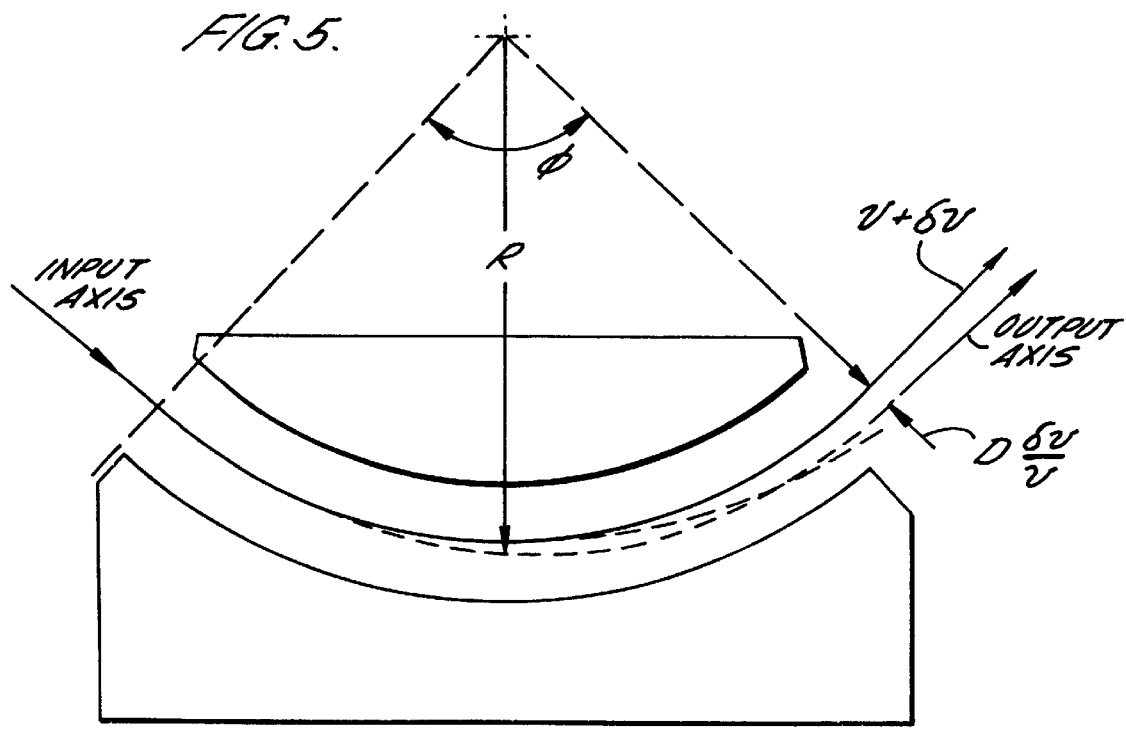
FIG. 5 is a schematic plan view of the filter illustrating the dispersive effect.

This dispersive effect is illustrated in FIG. 5. It should be noted that the formula for D applies to the non-relativistic limit wherein the beam particle velocity v is very small compared with the velocity of light, the usual case for implanter beams. Those trained in the art of ion beam transport theory will realize that the relativistic correction terms for eq. (6), while adding mathematical complication to account for the variation of particle mass with velocity do not fundamentally change the physical properties of the filter. A graph of $$\frac{D}{R}$$

versus $$\frac{R}{r}$$

for φ=35° as given by eq. (6), is shown as a broken curve in FIG. 4 where it can be seen that the dispersion of the filter can be varied by adjusting the magnetic curvature $$\frac{1}{r},$$

by varying in turn the magnitude (and sign) of the magnetic field B.

Further insight into the operating modes of the filter can be obtained by studying the quadratic nature of eq. (2). Since $$\frac{R}{r} = \frac{qBR}{\sqrt{2mU}} = \frac{k}{\sqrt{U}} \quad (7)$$

where $$k = \frac{qBR}{\sqrt{2m}} \quad (8)$$

eq. 2 can be written in a form showing the dependence on U explicitly:

$$\frac{U_0}{U} = 1 - \frac{k}{\sqrt{U}} \tag{9}$$

If a reduced velocity u is defined as $$u = v\sqrt{\frac{m}{2}} \tag{10}$$

then $$u^2 - ku - U_0 = 0 \tag{11}$$

As is well known from the theory of quadratic equations the mathematical roots of u are given by $$u = \frac{k \pm \sqrt{k^2 + 4U_0}}{2} \tag{12}$$

For the case of $E \geq 0$ it is always true that $k^2 + 4U_0 > 0$. Consequently, eq. 12 always has one and just one positive root. This is the case even if the magnetic field B is very strong and bucking the E field. Although a surprising result it is simply explained by the fact that there is always a low enough ion velocity v for which the velocity dependent magnetic force qBv becomes small enough for the impulsive electric force qE to dominate and provide the necessary net restoring force to balance the particle's centrifugal force $$\frac{mv^2}{R}.$$

The other root of eq. 12 is always negative v<0 but of no additional physical importance other than it represents a solution wherein the particle passes backwards through the filter.

For the case of the E bucking mode E<0, the roots of eq. 12 may be expressed in the form $$u = \frac{k \pm \sqrt{k^2 - 4|U_0|}}{2} \tag{13}$$

showing that if the magnetic field is strong enough, i.e.

$$k^2 > 4|U_0|. \tag{14}$$

there are two positive roots. If the energies corresponding to these two roots are $U_1$ and $U_2$ then $$U_1 = \frac{U_0^2}{U_2} \tag{15}$$

Having two beam energies selected by the filter simultaneously, is not in general troublesome in an ion implanter if the roots are far apart and there is a downstream dispersive element, such as the combination of the beam scanner 24 and collimator 25 of FIG. 1. In the particular case when $U_1 = U_2 = |U_0|$ the dispersion becomes zero and the cross field curved filter becomes an achromatic (i.e. energy independent) bend for an ion beam of a given mass to charge ratio. This is a novel compact type of achromatic bend that can be advantageously in other types of ion beam transport systems where it is necessary to avoid beam spot blurring as a result of energy spread in the beam.

As explained previously, an energy filter is required in the field of ion implanters utilizing radio-frequency acceleration because the radio-frequency accelerated beam includes not only ions at the required target energy, but also ions at other generally lower energies. Ions of incorrect energy can cause device degradation in some implantation processes. Also, in a scanning beam type implanter such as shown in FIG. 1 and described above, ions of incorrect energy are deflected differently by the scanning beam system, potentially causing a non-uniform irradiance across the wafer, and incorrect implant angles into the wafer. When filtering such beams from accelerators using a cross field curved filter, the highest dispersions and hence lowest energy spread are obtained by operating the filter with $E \geq 0$ and $B \leq 0$ as shown in FIG. 4.

A phenomena well known in pure electric and magnetic ion beam filters, also occurs in the $E \geq 0$ mode of operation of the cross field curved filter of the present invention. If the filter is tuned to accept a particle of mass m and charge q at an energy U the positive root of eq. 12 is $$u = \frac{k + \sqrt{k^2 + 4U_0}}{2} \tag{16}$$

Because $U_0$ and k in the above equation are each proportional to the charge q, the filter also passes particles of the same mass but a lower (or higher) charge state if such particles have a correspondingly lower (or higher) energy. However, if the filter operates in the bucking E<0 mode and is tuned to select an ion of a specific multiple charge, eq. 13 shows that there exists a range of magnetic field B values for which ions of the same mass but lower charge state are entirely rejected by the filter, irrespective of the energies of the lower charge state ions. This charge selectivity property is a novel feature of the cross field curved filter of this invention and is something that cannot be achieved with a single electric, or magnetic, or straight path cross field Wien filter. It arises because the term $k^2 - 4|U_0|$ under the square root of eq. 13 is a quadratic function of ion charge q and can therefore assume a positive value for an ion of high charge state and simultaneously negative values for all lower charge states of the ion. This charge selective operating mode is accompanied by a lower dispersion than achievable in the $E \geq 0$ operating mode but nevertheless is advantageous in the field of ion implanters using either radio-frequency or dc acceleration of multiple charge state ions as a means to obtain high implant energies.

As a quantitative example, consider how to tune the filter to select $P^{3+}$ beam ions and simultaneously reject all $P^{2+}$ beam ions, irrespective of their energy. In order to maintain a reasonably high dispersion (see FIG. 4), the magnetic deflection radius r for a $P^{3+}$ is selected to be just slightly less than the geometrical radius R of the filter, i.e., $$\frac{R}{r} = 1 + \varepsilon \tag{17}$$

where $\varepsilon$ is as small as possible. From eq. 2, it follows that $$U_0 = -\varepsilon U \tag{18}$$

where U is the energy of the $P^{3+}$ ion. For given E and B settings of the filter, the k and $U_0$ parameters for a $P^{2+}$ ion are obtainable from eqs. 4 and 7, i.e., $$k = \frac{2}{3}\frac{R}{r}\sqrt{U} = \frac{2}{3}(1+\varepsilon)\sqrt{U} \quad (19)$$

$$U_0[P^{2+}] = \frac{2}{3}U_0[P^{3+}] = -\frac{2}{3}\varepsilon U \quad (20)$$

From eq. 14, there are no real roots for a $P^{2+}$ ion provided $$0 > k^2 - 4|U_0| = \frac{4}{9}(1+\varepsilon)^2 U - \frac{8}{3}\varepsilon U = \frac{4}{9}(\varepsilon - 4\varepsilon + 1) \quad (21)$$

i.e. $\varepsilon$ must lie between the following limits:

$$3.732 > \varepsilon > 0.268 \quad (22)$$

Similarly, it can be shown that $P^{30}$ ions will be rejected if:

$$9.899 > \varepsilon > 0.101$$

In order to achieve a reasonable high dispersion D without the need to generate a very high magnetic field $\varepsilon$ can be set just above the lower limit for $P^{2+}$ ions–say $$\varepsilon = 0.3 \quad (23)$$

With this value of $\varepsilon$ both $P^{30}$ and $P^{2+}$ ions of any energy are rejected.

Choosing typical values for the implanter shown in FIG. 1

U=1500 keV ($P^{3+}$ energy)

R=634 mm eqs. 17, 2, 3, 4, 5 and 6 give

B=6.710 kG

D=80 mm $$E = 2 \times \frac{0.3U}{3R} = 0.473 \text{ kV/mm}$$

The above value for the magnetic field B is practically achievable, as is the electric field E The dispersion is approximately 36% of that which would be obtained if the filter were operated in a pure electric field mode.

As noted previously, in the bucking E<0 mode, the filter will also pass $P^{3+}$ ions of energy $$U_1 = \frac{U_0^2}{U} = \varepsilon^2 U = 0.09U = 135 \text{ keV}$$

In the implanter arrangement shown in FIG. 1, these low energy ions are not troublesome because they are strongly deflected to one side by the combined dispersions of the scanner and collimator magnets before they can impinge on the wafer.

The quantitative example above, illustrates tuning the filter to select $P^{3+}$ beam ions and reject $P^{2+}$ ions at all energies. More generally it can be shown that ions of type $A^{(q-n)+}$, where n=1,2, . . . , q–1, can be rejected when selecting $A^q$ ions, so long as $\varepsilon$ is in the range:

$$\frac{(\sqrt{q}-\sqrt{n})^2}{q-n} < \varepsilon < \frac{(\sqrt{q}+\sqrt{n})^2}{q-n} \quad (24)$$

Therefore, to select $P^{2+}$ and reject $P^+$, for example $$5.828 > \varepsilon > 0.172 \quad (25)$$

As mentioned, if $$\frac{R}{r} = 2,$$

equation (6) above indicates that dispersion is zero and the filter becomes an achromatic bend. From equations (2) to (5), the appropriate values of B and E are $$B = \frac{2\sqrt{2mU}}{qR}, \quad \text{and} \quad (26)$$

$$E = -\frac{2U}{qR}. \quad (27)$$

The ability of the described ion filter to provide adjustable energy dispersion (as illustrated in FIG. 4) can have special advantages in the field of ion implanters with radio frequency acceleration.

As explained previously, an energy filter is required in such ion implanters since the accelerated beam from the radio frequency accelerator includes not only ions at the target energy, but also ions at lower energies. Such lower energy ions could cause significant degradation if implanted in a wafer being processed at the higher energy. Also, where the high energy beam is scanned in a scanning beam type implanter such as described above, ions having lower than the desired energy will be deflected more by the beam scanning arrangement, potentially producing an uneven dose of ions across the wafer, and other dosimetry problems.

Figure 6:
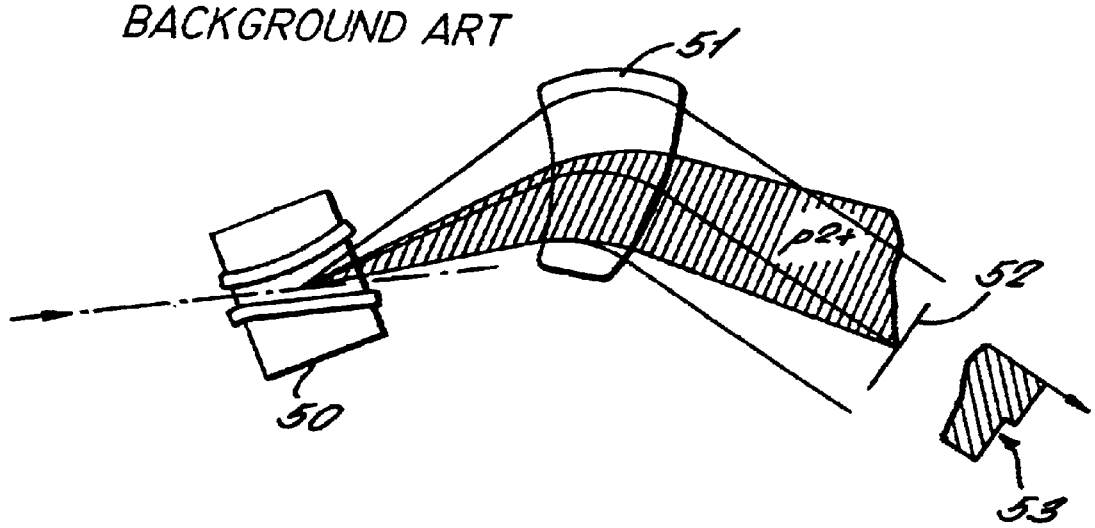
FIG. 6 is a schematic view illustrating a prior art arrangement of beam direction scanner and beam collimator.
Figure 7:
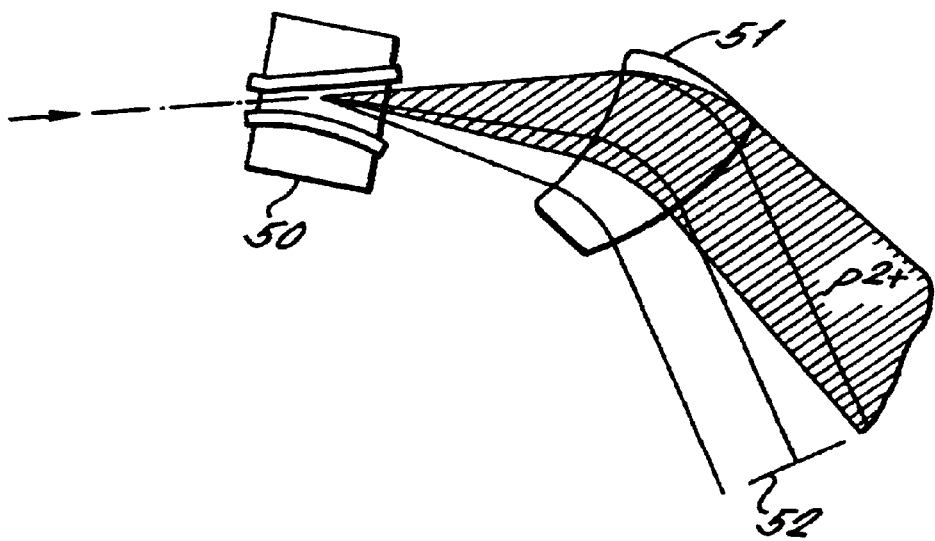
FIG. 7 illustrates the arrangement of beam direction scanner and beam collimator which can be used following a curved path cross field energy filter embodying the present invention and operating as a dispersion controller.

An advantage of the controllable dispersion capability of the described filter is illustrated in FIGS. 6 and 7. FIG. 6 illustrates the typical prior art arrangement of sequential beam scanner 50 and collimator 51, providing a parallel scanned beam at a target wafer 52. Even with an energy filter upstream of the beam scanner 50, there will be some variation in the energy of the ions in the beam entering the scanner. Accordingly, the scanner 50 has a dispersive effect on the beam ions according to their varying energies. Similarly, the collimator 51 will also have an energy dispersive effect. In the prior art arrangement illustrated in FIG. 6, the scanner 50 and the collimator 51 are arranged to deflect the ion beam in opposite directions, so that the energy dispersive effects of the scanner 50 and collimator 51 are also in opposite directions, so as to reduce the broadening of the beam at the target wafer 52 from the dispersive effect.

However, this reduced energy dispersion provided by the prior art arrangement of scanner and collimator also reduces the overall dispersive effect on ions in the beam of the wrong charge type. In a typical example, an ion implanter of the kind described above may be used for implanting triply charged phosphorus ions ($P^{3+}$). This is especially useful for high energy implantation of phosphorus. There is a tendency for triply charged phosphorus ions to form a lower charge state (e.g. $P^{2+}$) by interaction with the molecules of the residual gas in the vacuum chamber through which the beam passes. Any $P^{2+}$ ions in the beam leaving the RF accelerator should be removed by the energy filter 23. However, a smaller number of $P^{2+}$ ions can still be formed between the exit of the energy filter and the exit of the beam scanner 50. Such $P^{2+}$ ions will experience a charge state based dispersion relative to the $P^{3+}$ ions in both the beam scanner 50 and the collimator 51. Because the dispersive effect of the scanner 50 and collimator 51 are in opposite directions, $P^{2+}$ ions may still reach the target wafer 52 over a proportion only of the wafer surface. In the example illustrated in FIG. 6, $P^{2+}$ ions may be implanted over one half only of the wafer surface. This can result in a step-like variation in ion dose implanted in the wafer, such as illustrated in FIG. 6 at 53. A step change in dose over the wafer surface is extremely difficult, if not impossible to eliminate by known dose uniformity control procedures.

FIG. 7 illustrates the arrangement employed in the present embodiment in which the curvature applied to the beam by the collimator 51 is in the same direction as that applied by the scanner 50, so that the dispersive effect of the scanner and collimator is additive. As a result, the dispersive effect due to different charge states is much greater and $P^{2+}$ ions deflected by the scanner 50 do not reach the target wafer 52, and so do not cause the undesirable step variation in dose on the wafer experienced in the prior art arrangement. The greater energy dispersion resulting from the additive effect of the scanner and the collimator can be tolerated because the preceding energy filter can be used to control to the energy dispersion in the ion beam supplied to the scanner 50 so as to oppose the additive dispersion of the scanner and collimator 51, resulting in minimal energy dispersion of the ion beam at the target 52.

It should be noted that any form of energy dispersion control device located upstream of the scanning arrangement of FIG. 7 can be used to provide these advantages. For example to meet this particular requirement, the curved path cross field energy filter of FIGS. 1 to 3, could be replaced by a straight line Wien filter. However for an ion implanter using RF acceleration, a straight path Wien filter is undesirable since it cannot itself filter out ions having an undesired charge state.

Figure 8:
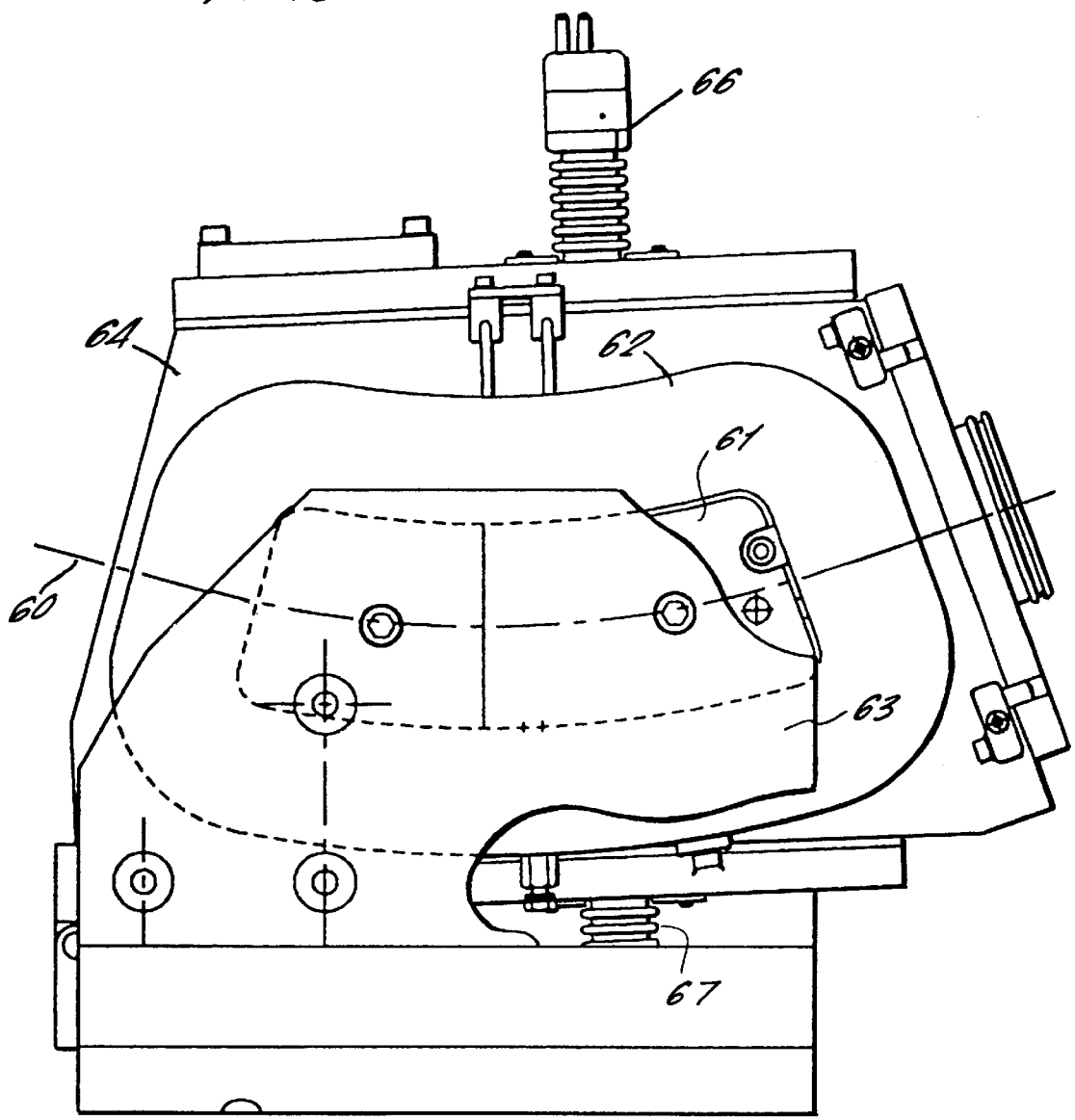
FIG. 8 is a plan view of a curved path cross field energy filter embodying the present invention.
Figure 9:
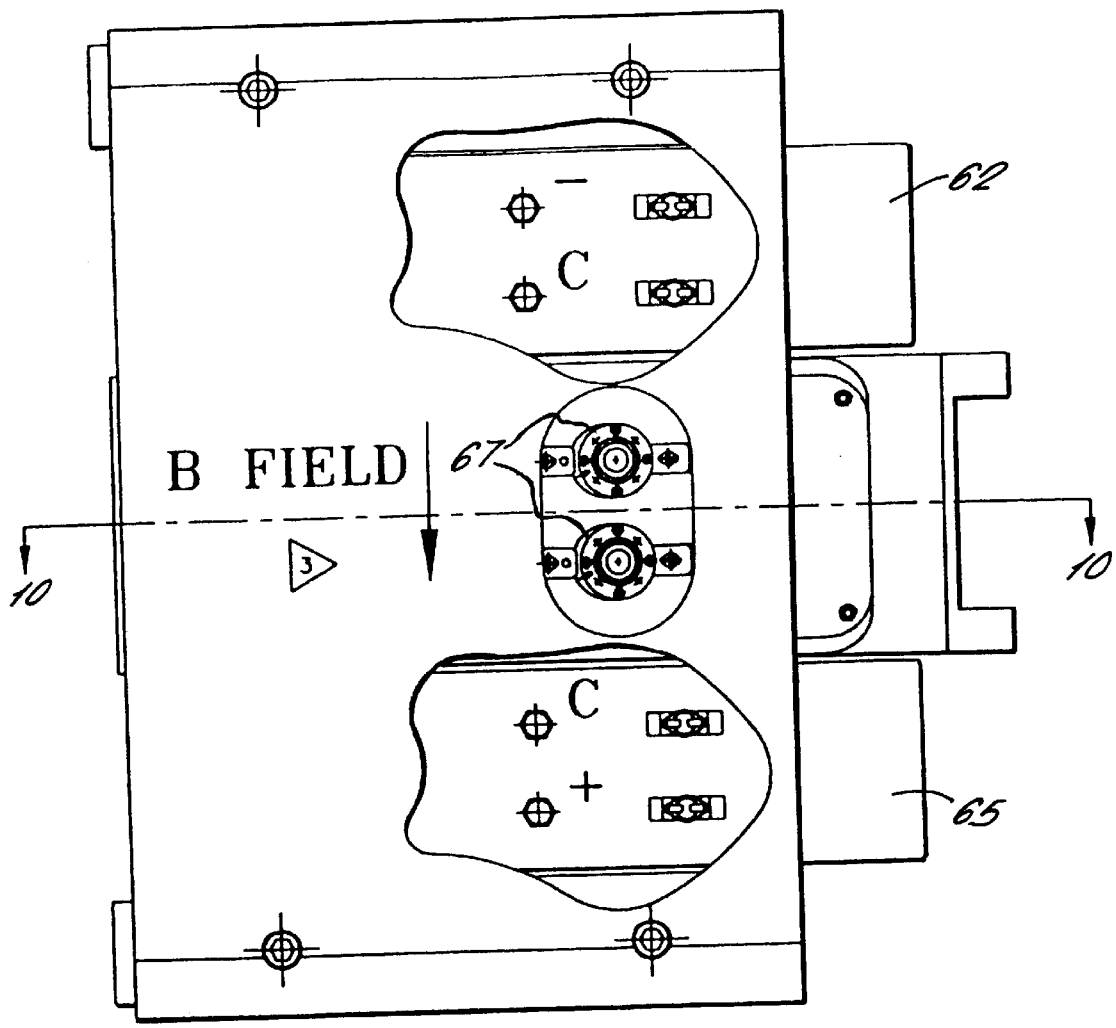
FIG. 9 is a view of the energy filter in elevation, viewed in the plane of curvature of the filter.

Referring now to FIGS. 8 and 9, these illustrate the external appearance of a preferred embodiment of the curved path energy filter shown in FIG. 3. The path of the ion beam through the filter is indicated by the curved line 60. The filter comprises a housing 64 containing the electrodes for creating the radially orientated electric field along the length of the curved path 60 within the housing. Magnetic pole pieces are also mounted in apertures on the upper and lower faces of the housing. The upper pole piece 61 is illustrated in FIG. 8. Energising windings 62 and 65 surround the pole pieces to generate the required magnetic field across the beam path 60. The two pole pieces on opposite sides of the housing 64 are interconnected by a magnetic flux return yoke 63, which is partially broken away in FIGS. 8 and 9 to reveal the underlying structure.

FIG. 8 also shows voltage feedthroughs 66 and 67 which provide connections to the electrodes within the housing. The housing includes sealing flanges at each end of the curve path 60 to enable the housing to be incorporated in the ion beam line, with the interior of the housing maintained under high vacuum.

Figure 10:
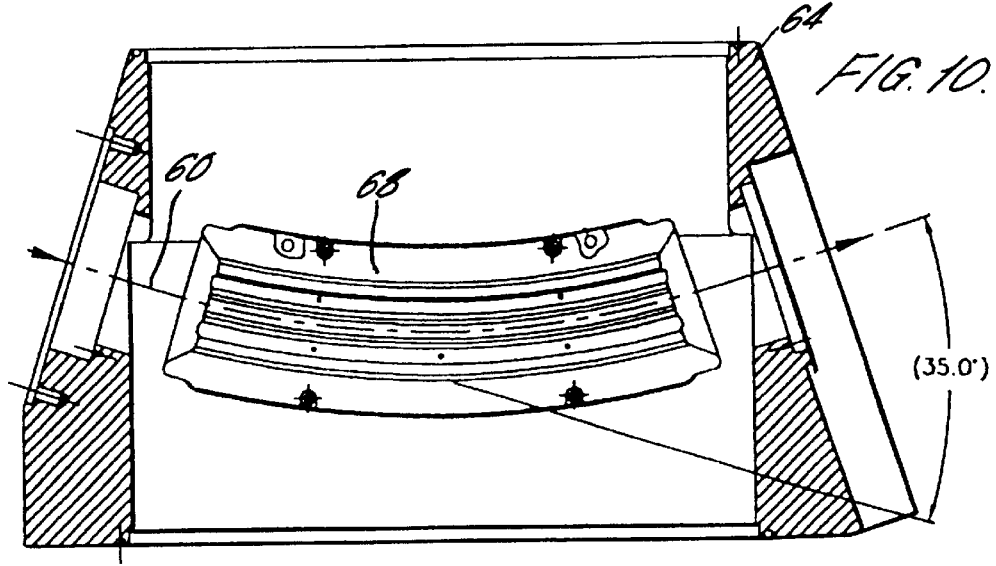
FIG. 10 is a sectional view of the filter taken along line 10—10 of FIG. 9 and illustrating one of the magnetic poles of the filter.
Figure 20:
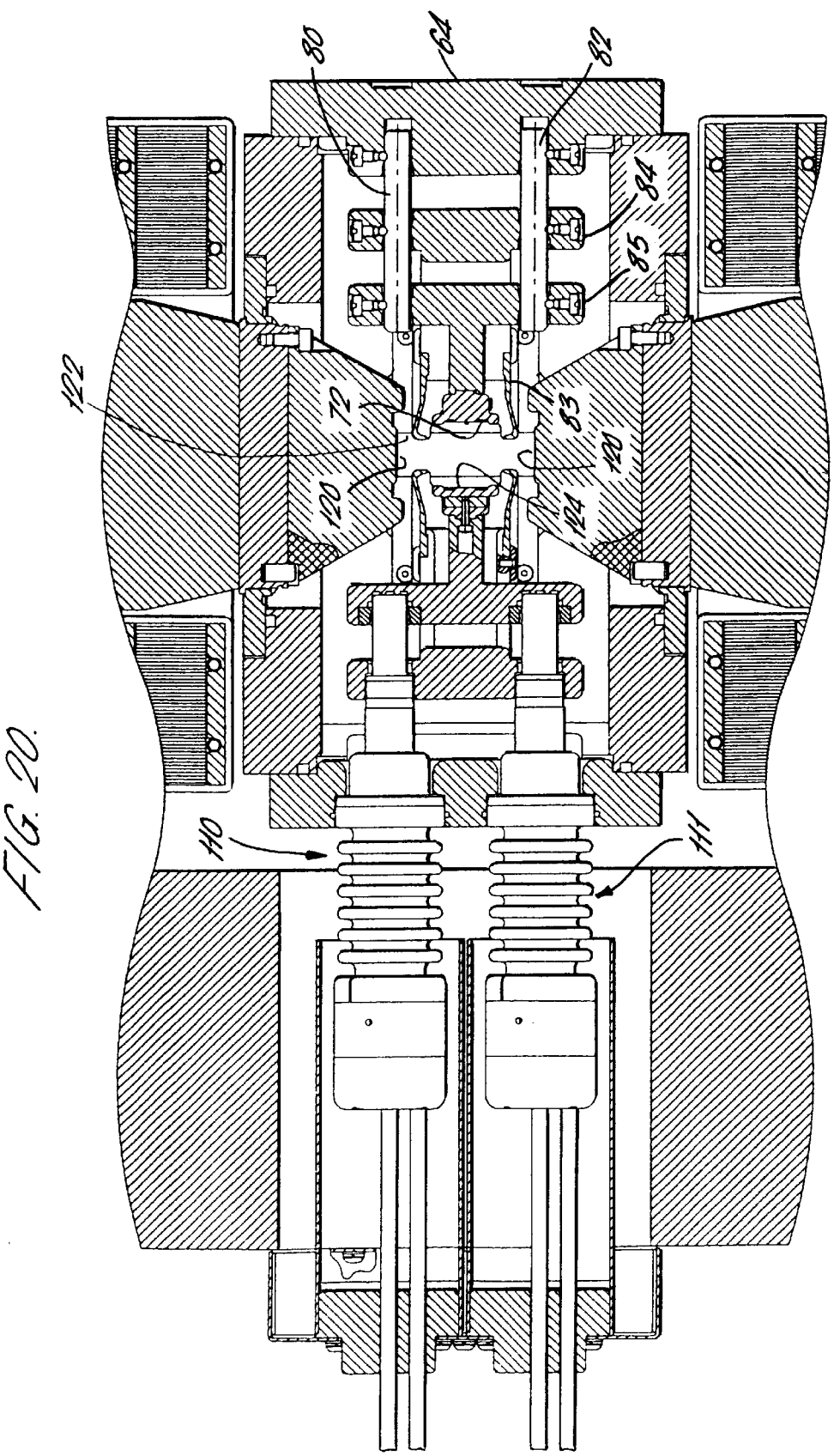
FIG. 20 is a partial sectional view of the filter in a plane normal to the beam path.

FIG. 10 is a cross-sectional view through the energy filter, taken along line 10—10 of FIG. 9, revealing the interior face 68 of one of the magnetic pole pieces, protruding into the housing 64 of the filter. As can be seen in FIGS. 10 and 20, the interior faces 120 of each of the opposing magnetic pole pieces are profiled so as to produce a homogeneous magnetic field along the length of the curved path 60, substantially over the radial width of the beam channel through the filter formed between the electrodes of the filter.

Figure 11:
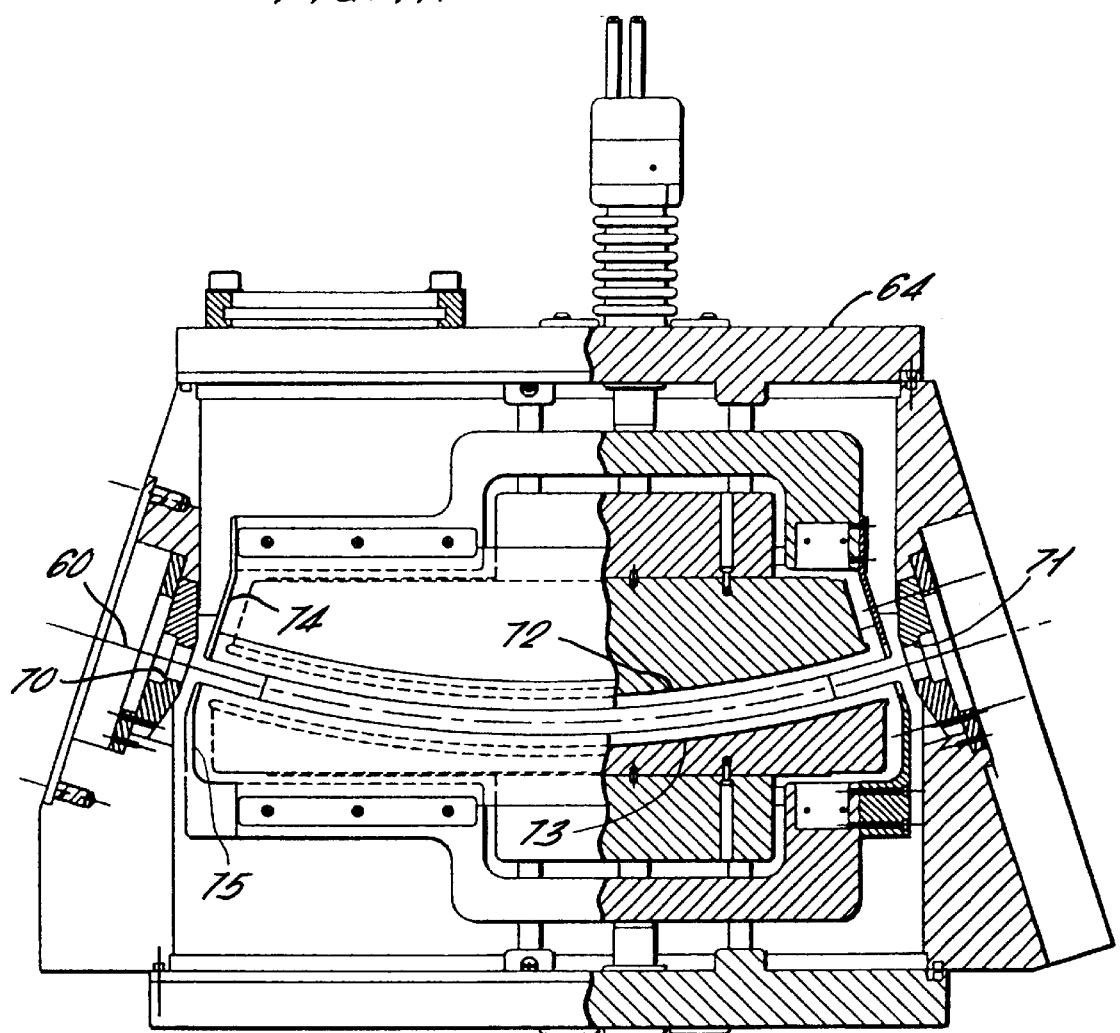
FIG. 11 is a more detailed plan view of the filter of FIG. 8 partially in cross-section illustrating the field electrodes of the filter.
Figure 12:
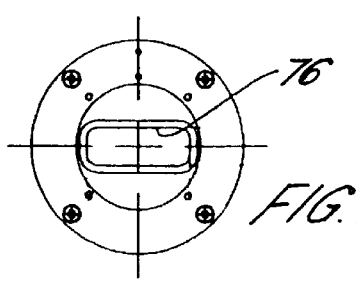
FIG. 12 is a view along the beam direction of one of the entrance and exit aperture plates defining the curved beam path through the filter.

Referring now to FIG. 11, the interior of the filter chamber 64 is illustrated, in a view similar to that of FIG. 10, but this time illustrating the electrodes forming the radial electric field along the curved beam path 60. In FIG. 11, the beam path 60 extends between an entrance aperture plate 70 and an exit aperture plate 71. The aperture plates 70 and 71 are illustrated in FIG. 11. Each plate defines a beam aperture 76 which has a narrower dimension in the plane of curvature of the beam through the filter. Between these apertures, the beam path is defined between a radially inner electrode 72 and a radially outer electrode 73. The inner electrode 72 is surrounded by an intermediate potential electrode screen 74, and the outer electrode 73 is surrounded by a corresponding intermediate potential electrode screen 75.

Figure 13:
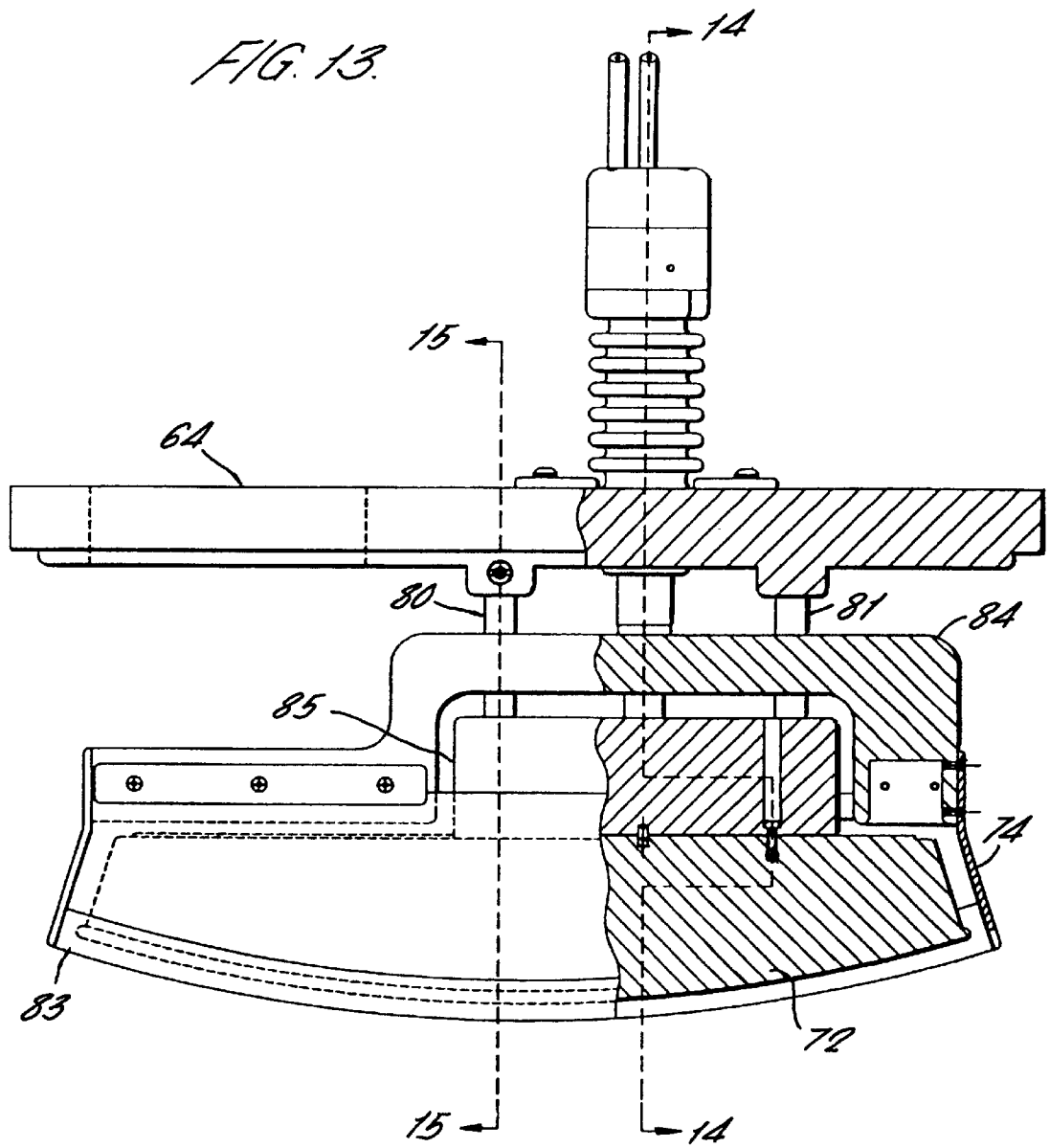
FIG. 13 is a detailed illustration, partially in cross-section, of the inner electrode of the filter.
Figure 14:
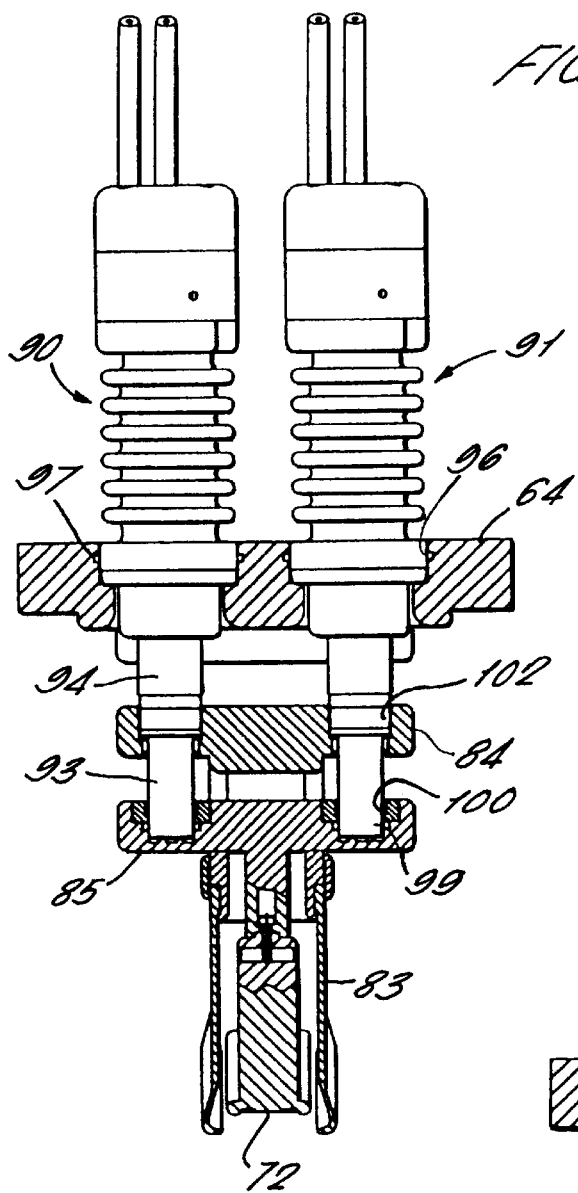
FIG. 14 is a view partially in section along line 14—14 of FIG. 13, illustrating the electrical connections to the inner electrode.
Figure 15:
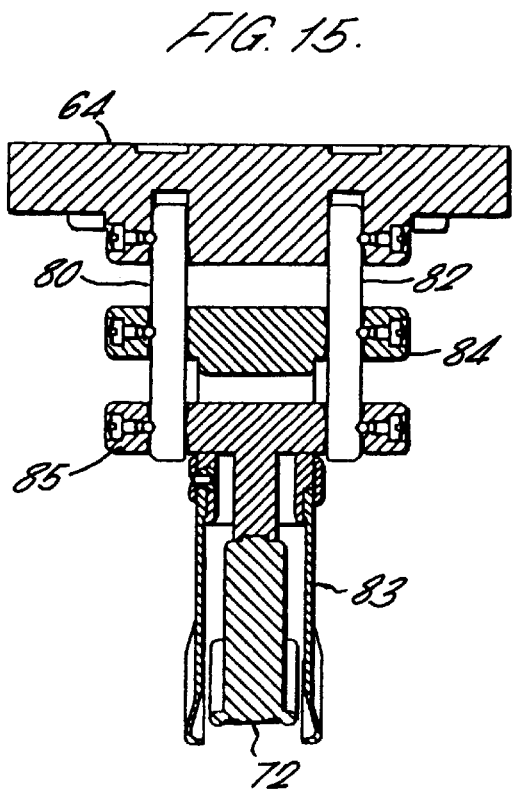
FIG. 15 is a sectional view along line 15—15 of FIG. 13 illustrating the mounting of the inner electrode.

The mounting of the inner electrode 72 within the housing 64 of the filter is illustrated in more detail in FIGS. 13, 14 and 15. The electrode structure, including both the electrode 72 itself and its surrounding intermediate potential screen 74, is mounted on the interior of the housing 64 by means of four ceramic insulating rods, of which two rods 8 and 81 can be seen in FIG. 13, and one additional rod 82 can be seen in FIG. 15. The fourth rode is correspondingly aligned with rod 81. These ceramic rods simultaneously support the electrode 72 and the intermediate potential shield 74.

The intermediate potential screen 74 has a skirt portion 83 extending along each long side of the electrode 72 and also across each end of the electrode. The skirt portion 83 is in turn connected to a supporting yoke 84 which is mounted to an intermediate part of the ceramic mounting rods 80, 81, 82.

The electrode 72 itself is connected to a supporting block 85 which is mounted to lower ends of the ceramic mounting rods 80, 81, 82. The upper ends of the rods 80, 81, 82 are mounted to the inner face of the filter housing 64.

Importantly, the intermediate potential screen 84 is everywhere electrically separate from the electrode 72.

Referring more particularly to FIG. 14, in combination with FIG. 19, the electrical connections to the electrode 72 and to the intermediate potential screen will now be described. Two separate electrical connections are made to the electrode 72 and two further separate connections are made to the screen 84. A pair of feedthroughs 90 and 91 each provide one connection to each of the electrode 72 and the screen 84. By using two separate connections to the electrode, the integrity of the supply of electric potential to the electrode can be confirmed. Further, one connection can be used for the application of the required electric potential and the other connection can be used for monitoring the potential applied.

Similarly, the double connection to the intermediate potential screen 84 can be used to confirm the integrity of the connections to the screen.

Figure 19:
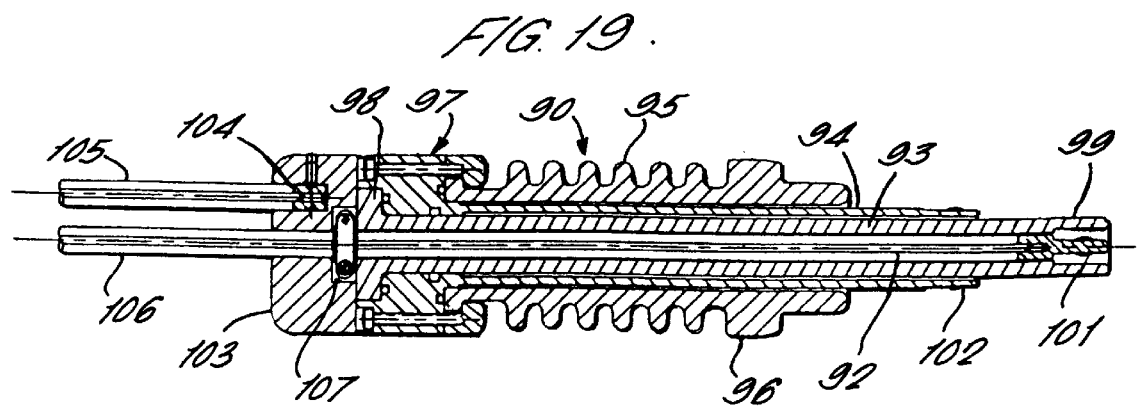
FIG. 19 is a sectional view of an electrical connector and feedthrough for applying the electrical potentials to the electrodes of the filter.

Referring to FIG. 19, the connection through each feed through 90, 91 to the electrode 72 is formed by an inner conductor 92 extending through a ceramic insulating tube 93. The ceramic insulating tube 93 is surrounded by a conducting sleeve 94 which extends inside an outer insulation bushing 95. When the feedthrough 90 is mounted in an aperture in the wall of the filter housing 64, the outer insulating bushing 95 is vacuum sealed to the housing at the shoulder 96 as illustrated particular at 97 in FIG. 14. An outer end of the conducting sleeve 94 has an enlarged shoulder 97 which is then vacuum sealed between an outer end of the bushing 95 and an outer end 98 of the inner insulating tube 93. The inner end 99 of the insulating tube 93 is then vacuum sealed in a blind bore 100 (FIG. 14) in the supporting block 85 of the electrode 72. An electrical connection is made to the electrode via the supporting block to an interconnecting member 101 mounted within the open end 99 of the insulating tube 93, and the end of the conductor 92 is in turn connected to the interconnecting member 101 as illustrated in FIG. 19.

An inner end portion 102 of the conducting sleeve 94 is electrically connected to the supporting yoke 84 of the intermediate potential screen 74.

The enlarged shoulder 97 at the outer end of the conducting sleeve 94 is electrically connected to a top cap 103, which is in turn connected at 104 to the conducting core of an insulated high voltage cable 105. A second insulated high voltage cable 106 is clamped by its outer insulation with the top cap 103 at clamp 107. Below the clamp 107, the insulated cable forms the central conductor 92 extending along the insulating tube 93 for connection to the electrode 72 via the interconnecting element 101.

As may be observed in FIGS. 11, 13 and also in FIG. 20, the skirt 83 of the intermediate potential screen 74 is located within the filter housing 64 so that the peripheral edge of the skirt 83 is substantially mid way between the outer edge of the electrode 72 and the surrounding components of the filter, including the aperture plates 70 and 71 and the magnetic pole pieces, which will normally be held at ground potential. Accordingly, if the screen 74 is maintained at half the potential applied to the electrode itself, the screen can control the potential gradient between the electrode and the surrounding interior components at ground potential, so as to maximise the uniformity of electric field in the beam path region between the electrodes and the magnetic poles.

Furthermore, as can be seen particularly in FIGS. 14 and 15, the electrode 72 is profiled to maximise the region of uniform electric field in the beam path. Similarly, the skirt 83 of the intermediate potential screen 74 is also profiled around the face of the electrode 72 directed towards the beam path, so as to maximise field uniformity.

In operation, a potential of up to ±60 kV relative to ground may be applied to the electrode 72 on the inner conductor 92 through the feedthrough 90. Then, an intermediate potential of about ±30 kV would be applied to the intermediate potential screen 74, via the cable 105 and the conducting sleeve 94 of the feedthrough.

It will be appreciated that the interior of the insulating tube 93 of the feedthrough 90 is at atmospheric pressure, since the vacuum seal to the tube 93 is at the inner end 99. However, the cable clamp 107 for the inner conductor 92 is itself at about half the potential applied to the inner conductor 92. As a result, the insulated length of the cable 92 within the insulating sleeve 93 can be reduced without risk of breakdown. Similarly, the top cap 103 together with the shoulder 97 of the conducting sleeve 94 are also at approximately half the potential applied to the electrode relative to ground, so that the tracking distance over the insulating bushing 95 can be reduced.

Figure 16:
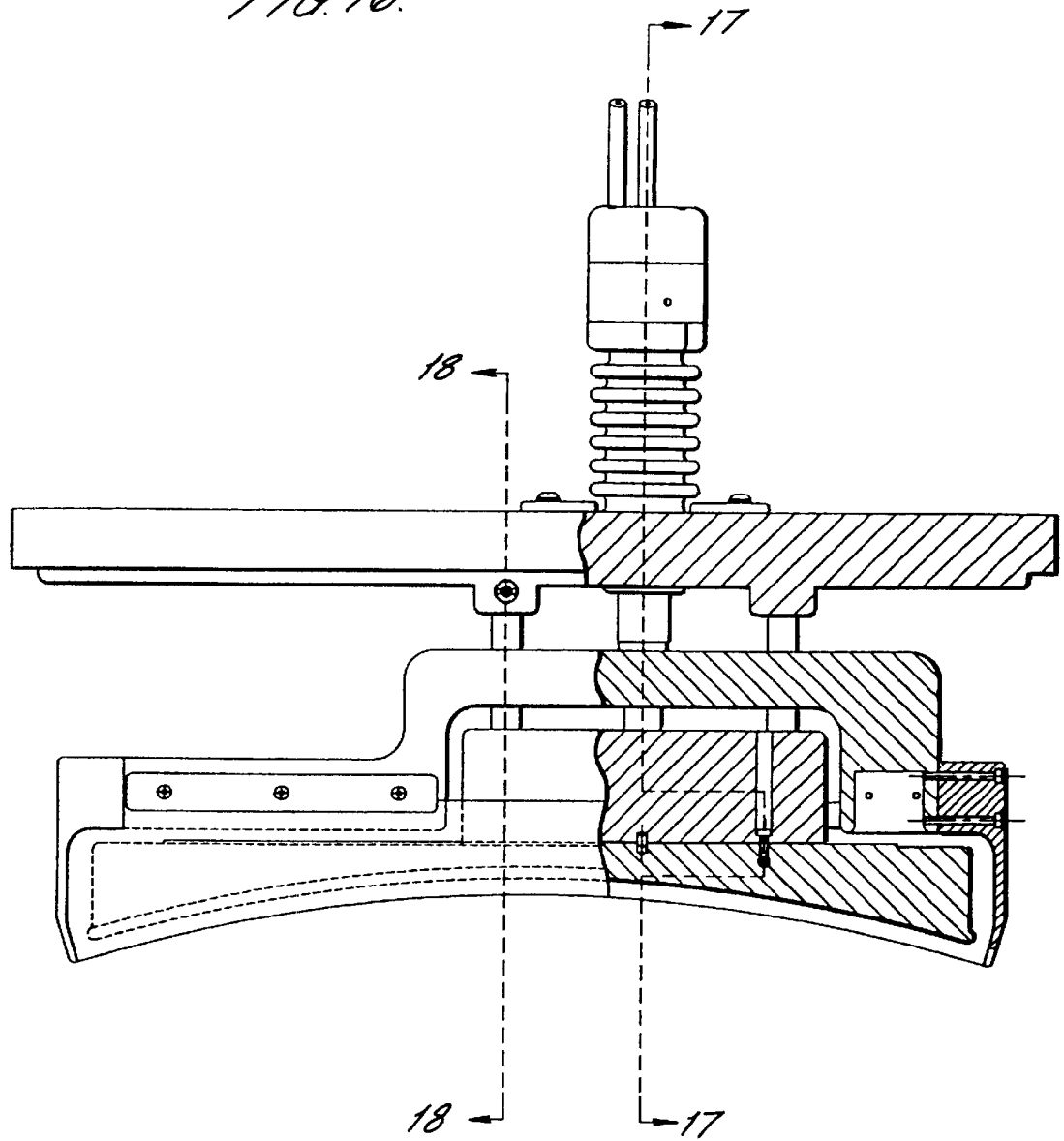
FIG. 16 is a detailed view partially in cross-section of the outer electrode of the filter.
Figure 17:
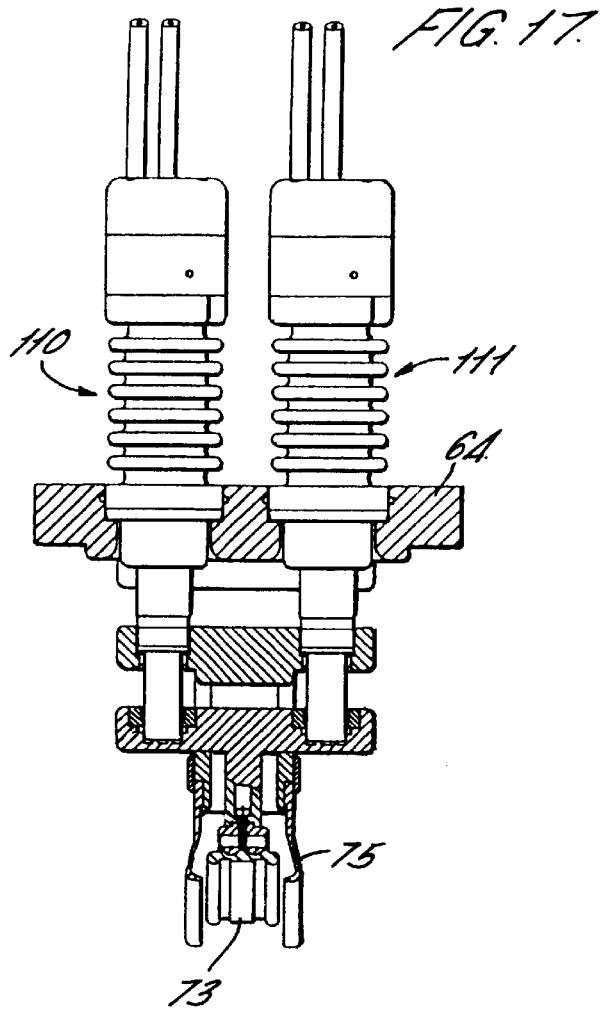
FIG. 17 is a partial sectional view taken along line 17—17 of FIG. 16 illustrating the electrical connection to the outer electrode.
Figure 18:
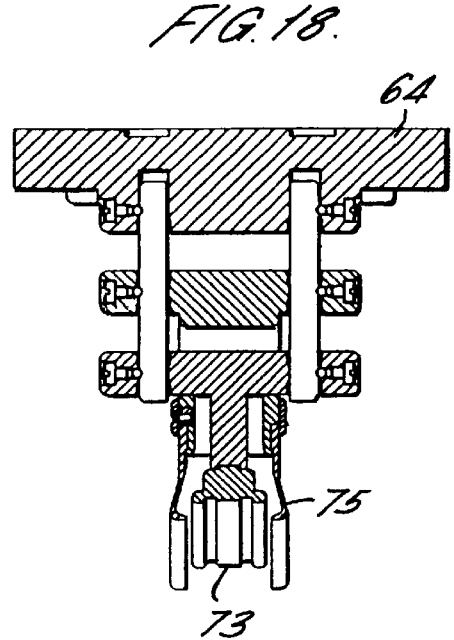
FIG. 18 is a sectional view along line 18—18 of FIG. 16, illustrating the mounting of the inner electrode.

FIGS. 16, 17 and 18 illustrate in more detail the outer electrode 73 of the filter. As can be seen from the drawings, the outer electrode 73 is mounted relative to the filter housing 64 in the same way as the inner electrode 72. Furthermore, the outer electrode and its corresponding intermediate potential screen 75 are profiled and shaped similarly to the inner electrode 72 and its screen 74. Again, a pair of feedthroughs 110 and 111 each provide a connection to the electrode 73 and a separate connection to the screen 75 for the outer electrode structure. The detail of the interconnection and operation of the outer electrode is the same as for the inner electrode and will not be described further.

Normally, equal and opposite potentials are applied to the inner and outer electrodes to generate the required electric field for operation of the filter.

Figure 21:
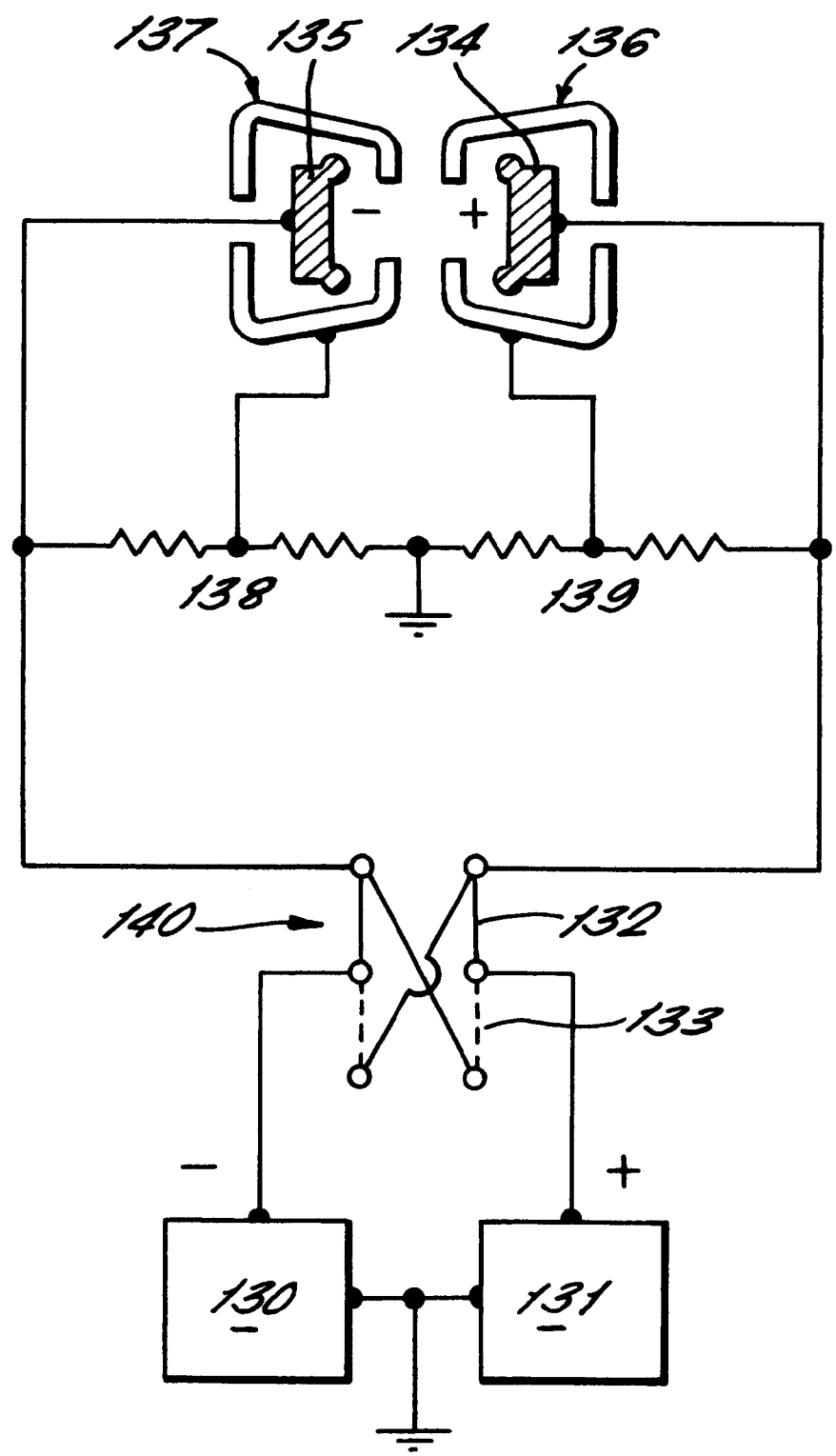
FIG. 21 is a block schematic diagram illustrating the application of deflecting potentials to the electrodes of the filter.

By way of example, referring to FIG. 21, power supplies 130 and 131 generate a controllable negative and positive electric potential respectively which is applied to electrodes 135 and 134 via a contactor in position 132 in a reversing switch 140. Resistor networks 138 and 139 generate intermediate negative and positive potentials on the intermediate skirt portions 137 and 136 respectively. Changing the reversing switch contactor to position 133 reverses the polarity applied to the electrodes.

A reversing switch can be similarly used between the coil power supply and the magnet coils to reverse the direction of current in the magnet coils and thus the direction of the magnetic field between the pole faces of the magnet. For example current carrying lines to the energising coils of the electromagnet, providing the magnetic field between the pole faces, may be connected via a reversing switch to a controllable current amplifier.

The above described curved oath cross field filter is only exemplary. Modifications to the described details of construction would be apparent to a person skilled in this art. In particular, referring to FIG. 20, the profiles of the electrodes 122, 124 and of the magnetic pole faces 120 can be modified respectively to generate electrostatic and magnetic quadrupole field components. These can be used to adjust the ion beam focusing characteristics of the filter.

What is claimed is:

1. An ion implanter comprising:
   an ion beam generator providing a beam including ions to be implanted in a substrate,
   an accelerator to accelerate the beam with ions to a desired implant energy, and
   an energy filter for removing non-desired ions from the accelerated beam before implantation in a substrate, the filter including a beam channel having a beam entrance and a beam exit, said beam channel defining, between said entrance and said exit, a predetermined curved path, in a plane of curvature, for the accelerated beam,
   electrodes arranged for producing over said curved path an electric field in said plane transverse to said path,
   magnetic poles arranged for producing over said path a magnetic field transverse to said plane, and
   a controller for controlling the strength of said electric field and the strength of said magnetic field to operate the energy filter selectively at least in a first mode with substantially zero magnetic field strength and a selected constant electric field strength, and in a second mode with substantially zero electric field strength and a selected constant magnetic field strength.

2. An ion implanter as claimed in claim 1, including a respective intermediate potential screen around each of said electrodes.

3. An ion implanter as claimed in claim 2, wherein said electrodes comprise a radially inner electrode having a radially outwardly directed face and a radially outer electrode having a radially inwardly directed face, said faces defining the radially inner and radially outer boundaries, respectively, of said beam channel, and each said intermediate potential screen has a skirt portion surrounding said face of the respective electrode.

4. An ion implanter as claimed in claim 2, including a vacuum housing having a housing wall, said housing containing said electrodes, and at least one electrical potential feedthrough assembly connected to each said electrode and mounted on said housing wall.

5. An ion implanter as claimed in claim 4, wherein each said feedthrough assembly has an inner electrical conductor connected to the respective electrode, an insulating tube containing said inner conductor, an electrically conductive sleeve around said insulating tube, said conductive sleeve being connected to said respective intermediate potential screen and extending through said housing wall, an insulating bushing mounting said conductive sleeve to said housing wall, and a connection point external to said housing for applying an intermediate potential to said conductive sleeve.

6. An ion implanter as claimed in claim 5, wherein said insulating tube has an inner end inside said vacuum housing wall which is vacuum sealed to the respective said electrode and an outer end open to atmosphere, and said inner electrical conductor comprises an insulated high voltage cable extending through said open end of the said insulating tube and connected to said electrode at said sealed inner end of said tube.

7. An ion implanter as claimed in claim 1, wherein said predetermined curved path has a constant radius of curvature and said electrodes are arranged to produce a radial electric field.

8. An ion implanter as claimed in claim 7, wherein said magnetic poles produce a magnetic field which is substantially normal to said plane of curvature.

9. An ion implanter as claimed in claim 8, wherein the controller is arranged to set the magnetic field (B) to have a polarity applying a radially inwardly directed force to beam ions along said curved path and to set the electric field (E) to have a bucking polarity applying a radially outwardly directed force to said beam ions such that $$B = \frac{(1+\varepsilon)\sqrt{2Um}}{qR}$$

and $$E = -\varepsilon \frac{2U}{qR},$$

where R is said radius of curvature, m, U and q are the mass, energy and charge state (>1) respectively of the ions desired for implantation on the substrate, and $$\frac{(\sqrt{q}-\sqrt{n})^2}{q-n} \leq \varepsilon \leq \frac{(\sqrt{q}+\sqrt{n})^2}{q-n}$$

where n=1, 2, ..., q−1.

10. An ion implanter as claimed in claim 9 and including an energy dispersive device acting on the filtered beam from said filter to remove from the beam to be implanted in the substrate ions having mass m and charge state q but energy less than U.

11. An ion implanter as claimed in claim 10, wherein said dispersive device is a beam scanner to scan the beam over the substrate.

12. An ion implanter as claimed in claim 11, wherein said dispersive device further includes a collimator for collimating the scanned beam, wherein said beam scanner and said collimator are arranged to provide energy dispersion additively in the same sense.

13. An ion implanter as claimed in claim 8, wherein said controller includes a voltage polarity reversing switch connected to said electrodes for reversing the polarity of voltage applied to the electrodes for changing between a positive electric field applying a radially inwardly directed force to beam ions along said curved path and a bucking electric field applying a radially outwardly directed force to said ions.

14. An ion implanter as claimed in claim 8 including magnetic coil windings associated with said magnetic poles for energising to produce said magnetic field, wherein said controller includes a polarity reverser for reversing the polarity of energising current in said coil windings for changing between a positive magnetic field applying a radially inwardly directed force to beam ions travelling in the beam direction along said curved path and a bucking magnetic field applying a radially outwardly directed force to said ions.

15. An ion implanter as claimed in claim 1, wherein said accelerator is a dc accelerator.

16. An ion implanter as claimed in claim 1, wherein said accelerator is an rf accelerator.

17. An ion implanter as claimed in claim 1, including a scanner for scanning the filtered beam from said filter to scan the beam over the substrate.

* * * * *